United States Patent
Kim

(10) Patent No.: US 7,457,606 B2
(45) Date of Patent: Nov. 25, 2008

(54) MIXER CIRCUIT FOR DIRECT CONVERSION TRANSCEIVER WITH IMPROVED IP2

(75) Inventor: Young-Jin Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 505 days.

(21) Appl. No.: 11/038,361

(22) Filed: Jan. 19, 2005

(65) Prior Publication Data

US 2005/0170806 A1 Aug. 4, 2005

(30) Foreign Application Priority Data

Jan. 30, 2004 (KR) ........................ 10-2004-0005995

(51) Int. Cl.
H04B 1/26 (2006.01)
H04B 1/28 (2006.01)
(52) U.S. Cl. ................... 455/323; 455/326; 455/333
(58) Field of Classification Search ............... 455/323, 455/326, 333
See application file for complete search history.

(56) References Cited

U.S. PATENT DOCUMENTS

| | | | | |
|---|---|---|---|---|
| 5,710,522 A | * | 1/1998 | Pass | 330/291 |
| 6,029,059 A | * | 2/2000 | Bojer | 455/326 |
| 6,073,001 A | * | 6/2000 | Sokoler | 455/323 |
| 6,404,263 B1 | | 6/2002 | Wang | 327/359 |
| 6,529,721 B1 | * | 3/2003 | Tiller | 455/323 |
| 6,597,899 B2 | * | 7/2003 | Souetinov et al. | 455/323 |
| 6,711,397 B1 | * | 3/2004 | Petrov et al. | 455/324 |
| 6,933,766 B2 | * | 8/2005 | Khlat et al. | 327/359 |
| 6,999,746 B2 | * | 2/2006 | Wang | 455/323 |
| 7,035,615 B2 | * | 4/2006 | Kim et al. | 455/317 |
| 7,130,604 B1 | * | 10/2006 | Wong et al. | 455/302 |

FOREIGN PATENT DOCUMENTS

| | | |
|---|---|---|
| JP | 10-233625 | 9/1998 |
| JP | 2000-151286 | 5/2000 |
| KR | 2002-0068128 | 8/2002 |

* cited by examiner

*Primary Examiner*—Duc M Nguyen
(74) *Attorney, Agent, or Firm*—F. Chau & Associates, LLC.

(57) ABSTRACT

A mixer for direct conversion transmitters and receivers using four phase-shifted local oscillation signals that are orthogonal each other to control a plurality of switches for outputting signals that are orthogonal each other. Two output signals that are orthogonal to each other do not mutually interfere and have a predetermined small signal gain. Further, a mixer may include four or eight switches controlled by four phase-shifted local oscillation signals that are orthogonal each other for outputting signals that are orthogonal to each other on an I-Q plot. The signals outputted from the switches controlled by four phase-shifted local oscillation signals remove I-Q mismatch and a DC component, and improve IP2 characteristics.

19 Claims, 12 Drawing Sheets

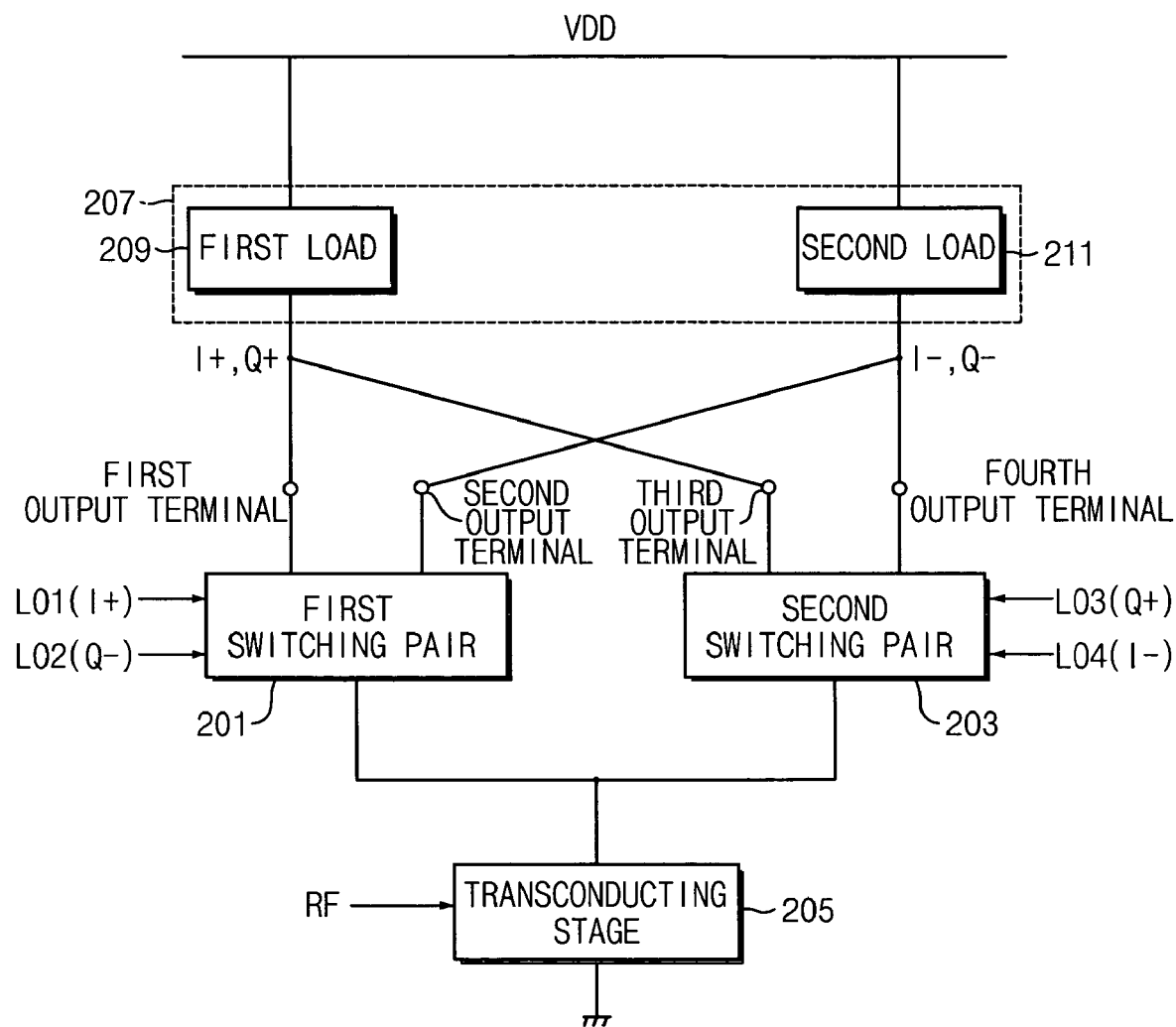

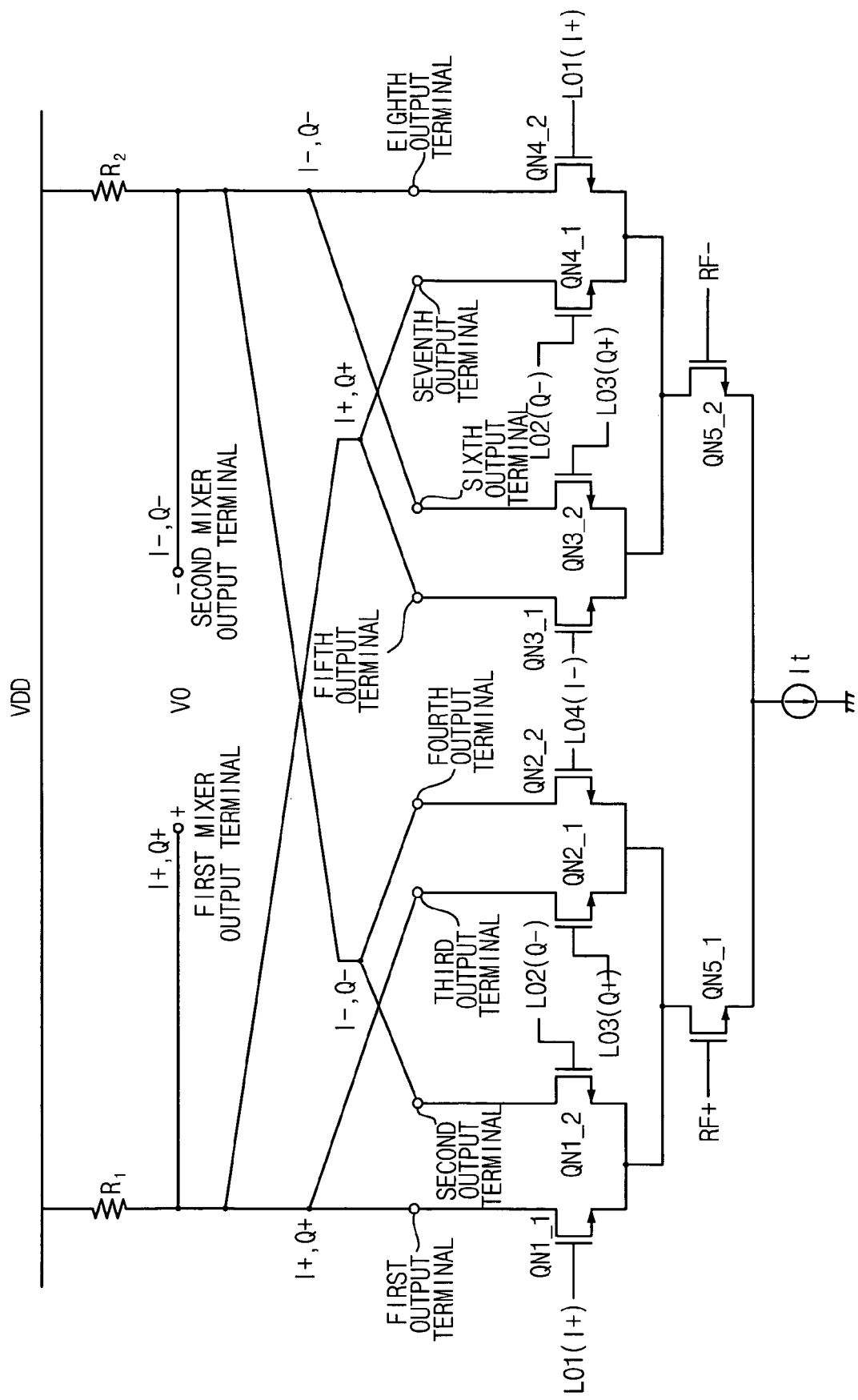

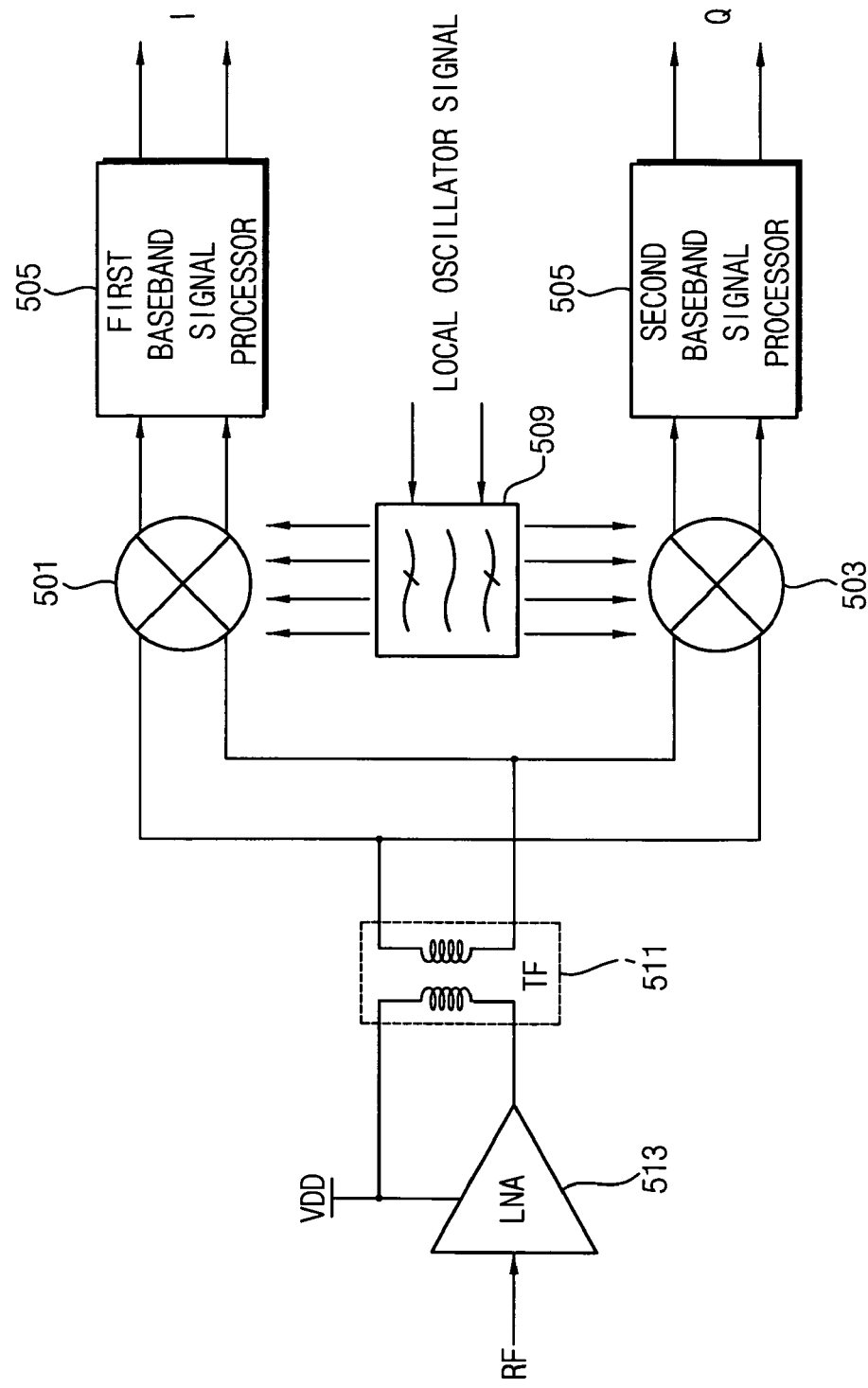

US 7,457,606 B2

MIXER CIRCUIT FOR DIRECT CONVERSION TRANSCEIVER WITH IMPROVED IP2

CLAIM FOR PRIORITY

This application claims priority under 35 USC § 119 to Korean Patent Application No. 2004-5995 filed on Jan. 30, 2004, the contents of which are herein incorporated by reference in its entirety.

BACKGROUND OF THE INVENTION

1. Field of the Invention

The present invention relates to a radio frequency communication system, and more particularly to a mixer circuit used in a direct conversion transmitter and receiver.

2. Description of the Related Art

The baseband signal in a radio frequency (RF) wireless communication system is converted into a (higher) carrier frequency for transmission and at the receiver the carrier frequency is converted back into a baseband signal. For transmission, the baseband signal is modulated to the carrier frequency and outputted to an antenna. A frequency conversion in the transmission is called an "up-conversion. For reception, the carrier signal is detected by an antenna and is demodulated to a baseband for its output. A frequency conversion in the reception is called a "down-conversion".

The up-conversion indicates that the baseband signal is converted into a carrier signal having frequency higher than the baseband signal, and the down-conversion indicates that the carrier signal is converted into the baseband signal having a frequency lower than the carrier signal.

The receiving/transmitting schemes of the related art are largely classified between a homodyne scheme and a heterodyne scheme.

The heterodyne scheme uses an intermediate frequency (IF) signal having a lower frequency than a RF signal in the reception/transmission, so that, in the transmitting and receiving system, amplification may be easily performed and selectivity and fidelity may be high.

The homodyne scheme is called a "direct conversion" and directly converts a carrier signal (RF) into a baseband signal. Thus, the "direct conversion" in the transmitting and receiving system indicates that a RF frequency is directly converted into a baseband frequency without the conversion into an intermediate frequency (IF). Such a direct conversion has the advantage that hardware employed may be simpler and power consumption may be minimized.

However, the direct conversion may have problems such as self-mixing, I-Q mismatch, and a DC component from the mixer.

Since the center frequency of an RF signal is substantially same as the LO frequency of a local oscillator, self-mixing results from the phenomenon that the signal of a local oscillator is applied to a RF input terminal (or a part of the RF signal is applied to an LO input terminal) by the coupling. Accordingly, a DC component that corresponds to a difference between two signals is generated in each input terminal. A solution to this problem involves increasing shielding or isolation.

The I-Q mismatch is generated when a direct conversion employs a quadrature structure in which the signal of a local oscillator is separated into signals which have a phase difference of 90° from each other and have the same magnitude, and then the separated signals are respectively applied to I and Q channel mixers. In case where two applied and separated signals have a different magnitude from each other or have a phase difference other than 90° between two signals, there is a high possibility that an error in a reception/transmission will occur.

Further, in a direct conversion, a second order intercept point (IP2 is typically considered by the communication system designer. An IP3 (Third Intercept Point) has a critical significance in a super heterodyne scheme using an intermediate frequency (IF). In a communication system, the signal having a baseband frequency is modulated to a carrier signal to be transmitted or received. When two or more frequencies pass through a non-liner system or circuit, a signal, which did not exist as an input signal, is output. This is called an intermodulation (IM). An IMD (Intermodulation Distortion) indicates a distortion by the IM component. The IMD raises a problem when two frequencies pass through a single non-liner system and components relating to the sum and the difference of harmonics of the two frequencies are detected at the output side and can interfere with modulation and demodulation.

However, in case of the direct conversion, not employing an IF, since the baseband signal in a mixer is directly converted from a carrier signal, the effect of the second IMD is greater than that of the third IMD term.

Thus, in case of the conversion of the carrier signal into an IF, the second IMD has a difference in frequency from the baseband of an original signal, but is adjacent to the baseband. And in case of a direct conversion, the second IMD is adjacent to the baseband signal. Hence, an adjustment of the second IMD term in a direct conversion is an important consideration in preventing a signal from being distorted.

An indicator the degree of interference of the second IMD term is the IP2 (Second Intercept Point). The IP2 indicates degree of the linearity of the system and is a very important parameter in a communication. A continuous increase of an input signal increases the second IMD signal, which was small at first, to the same power level as the original signal at the Second Intercept Point (IP2).

Therefore, the power point where the original signal frequency energy meets the second IMD is called the IP2.

The IP2 should be high in order that the linearity of a communication system is secured, which indicates the minimization of generation of the second IMD.

In general, a mixer for a direct conversion receiver is provided with an IP2 correction circuit, for adjusting the IP2.

FIGS. 1A and 1B are circuit diagrams illustrating a conventional mixer used in a direct conversion.

FIG. 1A is a circuit diagram illustrating the conventional single-balanced mixer used in a direct conversion.

Referring to FIG. 1A, the single-balanced mixer includes a switching pair (pair of switches) 101, a load impedance 103 and a transconducting stage 105. The transconducting stage 105 includes a current source It and a transistor Q1. A radio frequency (RF) signal is input to the gate of transistor Q1.

The switching pair 101 includes two switches S1 and S2. Switch S1 performs an on-off operation controlled by the local oscillator signal LO+. Switch S2 performs an on-off operation controlled by the local oscillator signal LO− having the phase difference of 180° compared to the local oscillator signal LO+.

The load impedance circuit 103 includes resistors R1 and R2. Usually, transistors are employed as switches S1 and S2 to make a single-balanced mixer have a small signal gain. The load impedance circuit 103 controls the small signal gain and is used in correcting the IP2.

FIG. 1B is a circuit diagram illustrating the conventional double-balanced mixer used in a direct conversion. The conventional double-balanced mixer is in the form of a Gilbert cell. A Gilbert cell is a cross-coupled differential amplifier. The Gilbert cell is used as an active mixer having a small signal gain and a load impedance 111 that controls the small signal gain and is used in correcting the IP2.

Referring to FIG. 1B, the double-balanced mixer includes two switching pairs 107 and 109, a load impedance 111, and a transconducting stage 113.

The two switching pairs of the double-balanced mixer include a first switching pair 107 (having switches S1 and S2) and a second switching pair 109 (having switches S3 and S4). The switches may be implemented as MOS (metal oxide semiconductor) transistors or as bipolar transistors. Both of the switches S2 and S3 perform an on-off (switching) operation controlled by the local oscillator signal LO+ and both of the switches S1 and S4 perform an on-off (switching) operation controlled by the local oscillator signal LO− having the phase difference of 180° compared to the local oscillator signal LO+.

The transconducting stage 113 includes transistors Q1 and Q2 each of which the radio frequency (RF) signal is input to, and a current source It, The RF signal may be input in that manner to a direct conversion receiver comprising the double-balanced mixer. In a transmitter comprising the double-balanced mixer, the baseband signal is input to the transistors Q1 and Q2.

The load impedance 111 includes resistors R3 and R4.

The conventional method for improving the IP2 is that the load impedance 111 is adjusted to have the same magnitude as the second harmonic component. This method of improving the IP2 characteristic has the limitation that it is necessary but difficult to finely adjust the load impedance 111. This method is more effective in a case where a frequency of the RF signal is relatively low. However, in a case where the frequency of the RF signal is relatively high, this method has the disadvantage that an I-Q mismatch is generated and the IP2 characteristic is degraded by even a minor change of the load impedance 111.

SUMMARY OF THE INVENTION

Embodiments of the invention provide mixers for a direct conversion transmitters and receivers. A first embodiment provides a direct conversion mixer having two switching pairs (pairs of switches), controlled using four phase-shifted local oscillation signals that are orthogonal each other for the switching pairs to output signals that are orthogonal each other on I-Q plot. Two output signals that are orthogonal to each other do not affect mutually interfere and have a predetermined small signal gain.

Generally, a mixer for a direct conversion transceiver may include four or eight switches, controlled by four phase-shifted local oscillation signals that are orthogonal each other to output signals that are orthogonal to each other on an I-Q plot.

The signals outputted from two the switches controlled by four phase-shifted local oscillation signals remove I-Q mismatch and a DC component, and improve IP2 characteristics. Embodiments of the invention provide a single-balanced mixer circuit having improved IP2 characteristics by modifying a mixer structure and a LO signal input terminal.

In some embodiments, a single-balanced mixer includes a first switching pair configured to receive a first local oscillator signal and a second local oscillator signal having a phase difference of about 90° with respect to the first local oscillator signal; a second switching pair configured to receive a third local oscillator signal having a phase difference of about 180° with respect to the second local oscillator signal and a fourth local oscillator signal having a phase difference of about 90° with respect to the third local oscillator signal and simultaneously a phase difference of about 180° with respect to the first local oscillator signal; a transconducting stage, coupled in common to the first switching pair and the second switching pair, configured to receive an input signal; and a load impedance circuit coupled between the first and second switching pairs and a supply voltage VDD. The transconducting stage may consist essentially of one amplifier (transistor) connected in series with a "current source" (e.g., a resistor).

In other embodiments, a double-balanced mixer includes a first switch configured to be controlled by a first local oscillator signal; a second switch configured to be controlled by a second local oscillator signal; a third switch configured to be controlled by a third local oscillator signal; a fourth switch configured to be controlled by a fourth local oscillator signal; a fifth switch configured to be controlled by the fourth local oscillator signal; a sixth switch configured to be controlled by the third local oscillator signal; a seventh switch configured to be controlled by the second local oscillator signal; and an eighth switch configured be controlled by the first local oscillator signal.

The second local oscillator signal has a phase difference of about 90° with respect to the first local oscillator signal; the third local oscillator signal has a phase difference of about 180° with respect to the second local oscillator signal; and the fourth local oscillator signal has a phase difference of about 90° with respect to the third local oscillator signal and simultaneously a phase difference of about 180° with respect to the first local oscillator signal.

In still other embodiments, a direct conversion receiver includes: a phase shifter configured to shift a phase of a local oscillator signal; a first mixer (of either one of the first and second mixer embodiments above) configured to perform a first down-conversion on said RF signal based on an output signal from said phase shifter; a first base band signal processor configured to generate a baseband signal corresponding to an in-phase component based on an output of the first mixer; a second mixer (e.g., same type as the first mixer) configured to perform a second down-conversion on said RF signal based on the output signal of the phase shifter; and a second base band signal processor configured to generate a baseband signal corresponding to a quadrature component based on the output of the second mixer.

In still other embodiments, a direct conversion transmitter includes a phase shifter configured to shift a phase of a local oscillator signal; a first baseband signal processor configured to receive a baseband signal corresponding to an in-phase component; a first mixer (of either one of the first and second mixer embodiments above) configured to receive an output of the first baseband signal processor and configured to perform a first up-conversion on a RF signal based on an output signal of the phase shifter, a second baseband signal processor configured to receive a baseband signal corresponding to a quadrature component; and a second mixer (e.g., same type as the first mixer) configured to receive an output of the second baseband signal processor and configured to perform a second up-conversion on the RF signal based on the output signal of the phase shifter.

Further, it is another feature of the present invention to provide a direct conversion transceiver using a receiver and a transmitter including mixer circuits of the single-balanced mixer embodiment or of the double-balanced mixer embodiment.

BRIEF DESCRIPTION OF THE DRAWINGS

The above and other features of the present invention will become more apparent by describing in detail exemplary embodiments thereof with reference to the accompanying drawings, in which:

FIGS. 2A to 2C are block and circuit diagrams illustrating a single-balanced mixer according to an exemplary embodiment of the present invention;

FIGS. 3A to 3C are block and circuit diagrams illustrating a double-balanced mixer according to another exemplary embodiment of the present invention;

FIG. 5A is a block diagram illustrating a direct conversion receiver including a mixer according to an embodiment of the invention.

DETAILED DESCRIPTION OF THE EXEMPLARY EMBODIMENTS

Figure 1A:
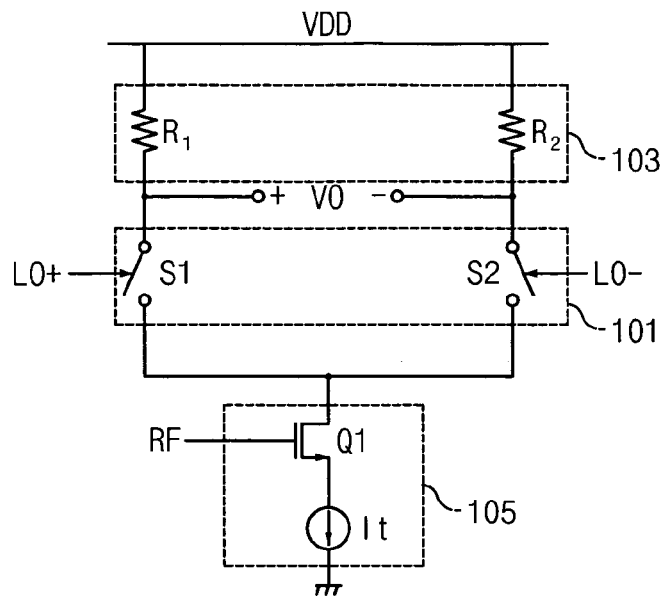
FIGS. 1A and 1B are circuit diagrams illustrating conventional mixers used for direct conversion.
Figure 1B:
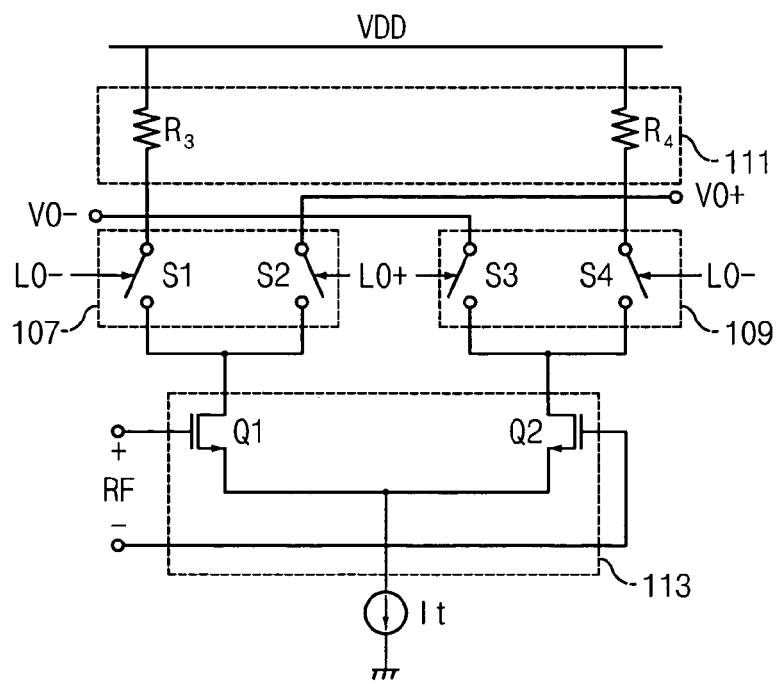
Figure 2B:
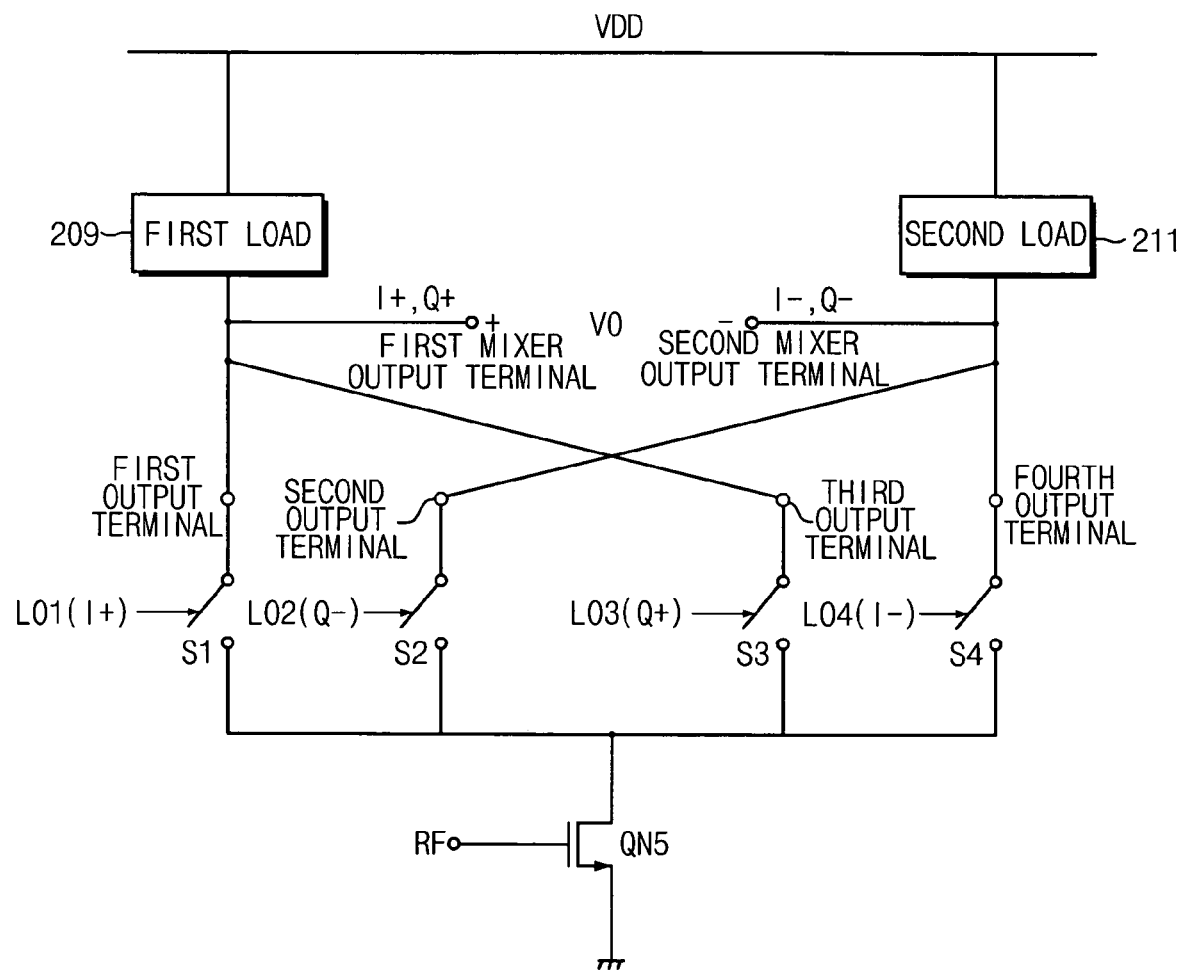
Figure 2C:
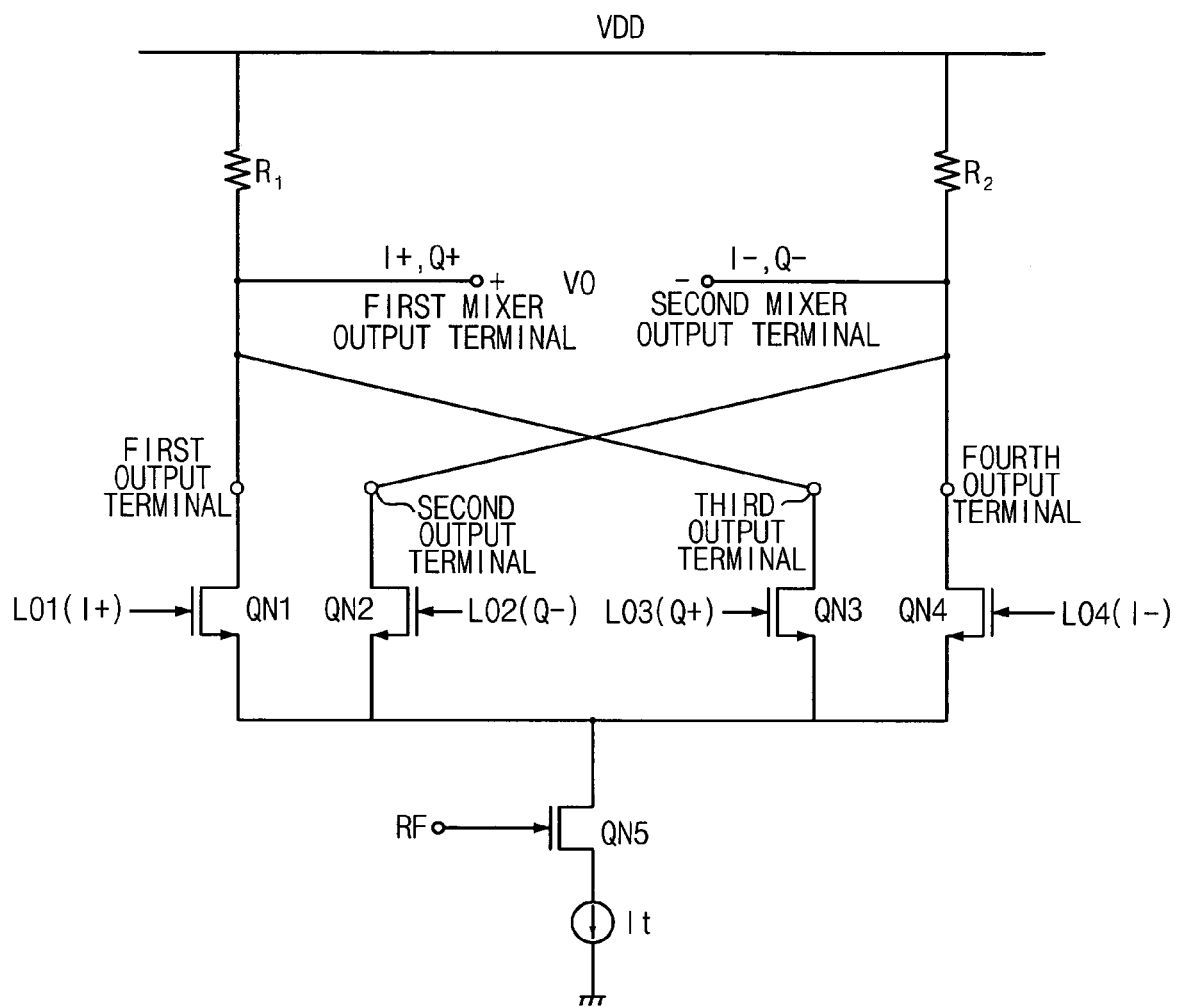

FIGS. 2A 2B, and 2C are block and circuit diagrams illustrating a single-balanced mixer according to an exemplary embodiment of the present invention.

While a conventional single-balanced mixer includes a switching pair and one transconducting stage (having one transistor), a mixer according to the present embodiment includes two switching pairs and one transconducting stage (having one transistor). Thus, the mixer of the exemplary embodiment of the present invention may not be a "single-balanced" mixer in the strictest sense. However, for convenience, the mixer of the first exemplary embodiment will be hereinafter called a single-balanced mixer.

The single-balanced mixer of FIG. 2A, includes a first switching pair 201, a second switching pair 203, a transconducting stage 205, and a load impedance circuit 207.

The first switching pair 201 receives a first local oscillator signal LO1 and a second local oscillator signal LO2. In a case where the first local oscillator signal LO1 is a reference signal, LO1 falls within I+(in-phase) signal on an I-Q plot and is denoted as LO1(I+). The second local oscillator signal LO2 has a phase difference of 90° compared to the first local oscillator signal LO1. If the first local oscillator signal LO1 falls within I+(in-phase) signal, then the second local oscillator signal LO2 falls within Q-(quadrature), on the I-Q plot. Preferably, the LO1 signal and LO2 signal have the same magnitude each other and a phase difference of 90° from each other.

The second switching pair 203 receives a third local oscillator signal LO3 and a fourth local oscillator signal LO4. In a case where the second local oscillator signal LO2 is a Q- signal, the third local oscillator signal LO3 is a Q+ signal (and in an alternate case where LO2 is a Q+ signal, the third local oscillator signal LO3 is Q- signal). Thus, the LO2 signal and LO3 signal have a phase difference of 180° relative to each other. Likewise, the fourth local oscillator signal LO4 has a phase difference of 180° compared to the first oscillator signal LO1. Thus, the fourth local oscillator signal LO4 falls within the I- signal on the I-Q plot. Preferably, the LO3 and LO4 local oscillator signals have the same magnitude, and a phase difference of 90° from each other.

The load impedance circuit 207 has a first load 209 and a second load 211. One end of the first load 209 is coupled to a first output terminal of the first switching pair 201 and to a third output terminal of the second switching pair 203. The other end of the first load 209 is connected to a supply voltage VDD.

Further, one end of the second load 211 is coupled to a second output terminal of the first switching pair 201 and to a fourth output terminal of the second switching pair 203. The other terminal of the second load 211 is connected to the supply voltage VDD.

The transconducting stage 205 is connected between a common node (coupled to the first switching pair 201 and the second switching pair 203) and a ground voltage or VSS. In a case where the single-balanced mixer is used in a direct conversion transmitter, a baseband signal is input to the transconducting stage 205. In a case where a single-balanced mixer is used in a direct conversion receiver, a RF signal is input to the transconducting stage 205.

Referring to FIG. 2B, the first switching pair (201 of FIG. 2A) includes switches S1 and S2. The switch S1 is controlled by the first local oscillator signal LO1(I+) and the switch S2 is controlled by the second oscillator signal LO2(Q-). Further, the second switching pair (203 of FIG. 2A) includes switches S3 and S4. Switch S3 is controlled by the third local oscillator signal LO3(Q+) and switch S4 is controlled by the fourth local oscillator signal LO4(I-).

The first load 209 is connected between a common node (coupled to the first output terminal of the first switch S1 and to the third output terminal of the third switch S3) and to a power supply voltage VDD. Similarly, the second load 211 is connected between a common node (coupled to the second output terminal of the second switch S2 and to the fourth output terminal of the fourth switch S4) and to the power supply voltage VDD.

An RF signal is input to the gate of a transistor QN5. One electrode of transistor QN5, which performs a small signal model function for the transconducting stage, is coupled in common to the four switches S1, S2, S3, and S4; and another electrode of transistor QN5 is connected to ground or VSS. Since a bias current should be applied through transistor QN5 in order to operate the switching circuits (through switches S1, S2, S3, and S4), the transconducting stage should include a current source. However, in view of the small signal model, the current source in the transconducting stage 205 may be modeled as a resistor (not shown for convenience of explanation).

The switches S1, S2, S3, and S4 perform an on-off (switching) operation in accordance with the control of the local oscillator signals LO1, LO2, LO3, and LO4, respectively, and an RF signal input to the gate of a transistor QN5 is multiplied by the local oscillator signals LO1 to LO4 (so that the multiplied signal may be outputted through the output terminals of switches S1, S2, S3, and S4, respectively. Further, the local oscillator signals are square waves or sine waves.

The RF signal is multiplied by the first local oscillator signal LO1(I+) (which controls operation of the first switch S1) and by the third local oscillator signal LO3(Q+) (which controls operation of the third switch S3). Therefore, an I+ signal and Q+ signal on the I-Q plot are output from the first output terminal and third output terminal (and summed at a common node being the First Mixer Output Terminal). Further, since an in-phase component and quadrature component do not mutually interfere on the I-Q plot, output signals having the same amplitude but a phase difference of 90° can be obtained (and summed at the common node being the First Mixer Output Terminal).

Further, the RF signal is multiplied by the second local oscillator signal LO2(Q−) (which controls operation of the second switch S2) and by the fourth local oscillator signal LO4(I−) (which controls operation of the fourth switch S4). Therefore, an I− signal and Q− signal on the I-Q plot are output from the second output terminal and fourth output terminal (and summed at a common node being the Second Mixer Output Terminal). Further, since the above I− signal and Q− signal are orthogonal to each other on the I-Q plot, they do not interfere with each other. Accordingly, in case where the local oscillator signals LO1, LO2, LO3, and LO4 have the same magnitude, output signals having the same magnitude and a phase difference of 90° can be obtained at the second output terminal and the fourth output terminal.

Further, since signals output at the first and second mixer output terminals have a phase difference of 180° from each other, a mismatch on the I-Q plot can be avoided and a second IMD (InterModulation Distortion) can be minimized.

FIG. 2C is a circuit diagram illustrating a single-balanced mixer implemented with MOS transistors according to an exemplary embodiment of the present invention.

Referring to FIG. 2C, the first switching pair (201 of FIG. 2A) includes a first transistor QN1 and second transistor QN2. Hence, the first switch S1 of FIG. 2B corresponds to the transistor QN1 and the second switch S2 of FIG. 2B corresponds to the transistor QN2. The first local oscillator signal LO1(I+) is input to the gate of transistor QN1 (switch S1) and the second local oscillator signal LO2(Q−) is input to the gate of transistor QN2 (switch S2).

Similarly, the second switching pair (203 of FIG. 2A) includes a third transistor QN3 and a fourth transistor QN4. The third switch S3 of FIG. 2B corresponds to the transistor QN3 and the fourth switch S4 of FIG. 2B corresponds to the transistor QN4. The third local oscillator signal LO3(Q+) is input to a gate of transistor QN3 and the fourth local oscillator signal LO4(I−) is input to a gate of transistor QN4.

The first output terminal of transistor QN1 and the third output terminal of transistor QN3 are commonly coupled to a resistor R1 (of load impedance circuit 207 of FIG. 2A). Hence, resistor R1 corresponds to the first load (209) of FIG. 2B. Similarly, the second output terminal of transistor QN2 and the fourth output terminal of transistor QN4 are commonly coupled to a resistor R2 (of load impedance circuit 207 of FIG. 2A). Hence, resistor R2 corresponds to the second load (211) of FIG. 2B.

The transconducting stage (205 of FIG. 2A) includes a transistor QN5 connected in series with a current source It. The RF signal is input to the gate of the above transistor QN5. Further, a drain of the transistor QN5 is in common coupled to the four transistors QN1, QN2, QN3, and QN4, and a source of transistor QN5 is coupled to the current source It. The current source It supplies bias current to the transistors constituting the first and second switching pairs.

In accordance with the control of the local oscillator signals LO1 to LO4, the above transistors perform the on-off operation, and accordingly, the RF signal input to the gate of the transistor QN5 is multiplied by each of the LO1 to LO4 signals so that the multiplied signal may be outputted from each of the output terminals of transistors. Further, the local oscillator signals may be either a square wave or a sine wave.

The RF signal is multiplied by the first local oscillator signal LO1(I+) (which controls operation of the transistor QN1) and the third local oscillator signal LO3(Q+) (which controls operation of the transistor QN3). Therefore, I+ signal and Q+ signal on the I-Q plot are outputted from the first output terminal and the third output terminal and summed. The outputted signal has a predetermined small signal gain controlled by a small signal output resistance of each transistor and the resistor R1. Further, since an in-phase component and quadrature component do not interfere on the I-Q plot, the output signals having the same size and phase difference of 90° from each other can be obtained.

Similarly, the RF signal is multiplied by the second local oscillator signal LO2(Q−) (which controls the operation of the transistor QN2) and by the fourth local oscillator signal LO4(I−) (which controls the operation of the transistor QN4). Therefore, the I− signal and Q− signal on the I-Q plot are outputted from the second output terminal and the fourth output terminal in and are summed. The outputted signal has a predetermined small signal gain controlled by the small signal output resistance of each transistor and the resistor R2. Further, since the I− signal and Q− signal are orthogonal to each other on the I-Q plot, they do not interfere with each other. Accordingly, in case where the local oscillator signals LO1, LO2, LO3, and LO4 have the same magnitude, the output signals at the second output terminal and fourth output terminal can have the same magnitude and a phase difference of 90° from each other. Further, since the signals at the first and second mixer output terminals have a phase difference of 180° from each other, mismatch on the I-Q plot is avoided and the occurrence of the second IMD (IMD2) can be minimized.

Even though the switches are depicted as being made of MOS transistors in FIG. 2C, the switches also can be made of bipolar transistors, and alternatively of other forms of switches. Further, preferably, the resistors R1 and R2 have the same value and are accompanied with a capacitor or inductor according to type of use to be constituted as an impedance circuit (e.g., whose impedance magnitude changes according to frequency).

In FIG. 2C, a signal input to the gate of the transistor QN5 is the RF signal. Such a configuration used in case where the single-balanced mixer is employed in a direct conversion receiver. Moreover, since a direct conversion is performed, an intermediate frequency is not outputted, and a center frequency of the RF signal is substantially identical to the frequency of the local oscillator signals.

Further, in case where the single-balanced mixer is employed in a direct conversion transmitter, a baseband signal is applied to the gate of the transistor QN5. Accordingly, the frequency of the local oscillation signal is substantially identical to a center frequency of the differential signal Vo between first and second mixer output terminals.

Figure 3A:
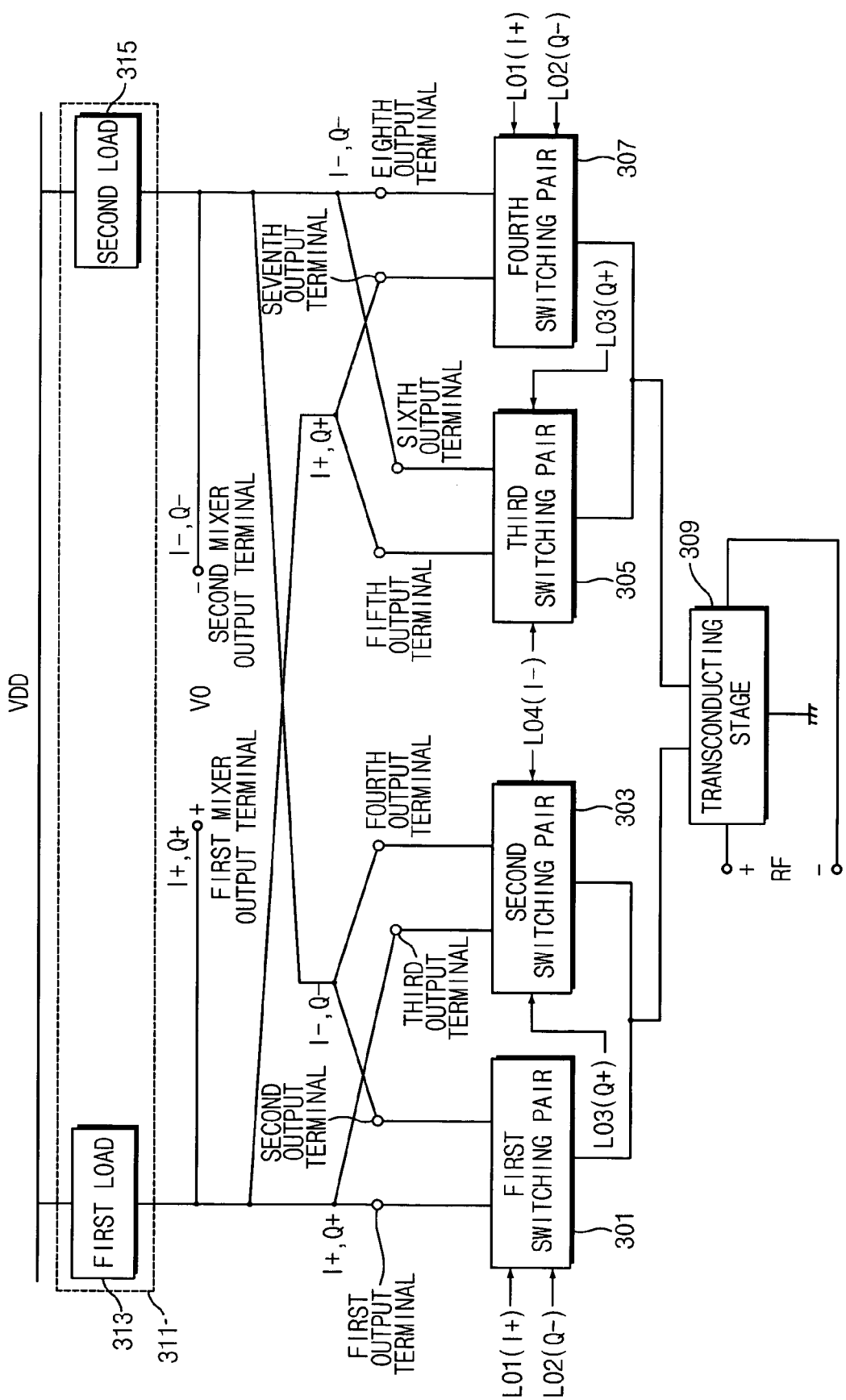
Figure 3B:
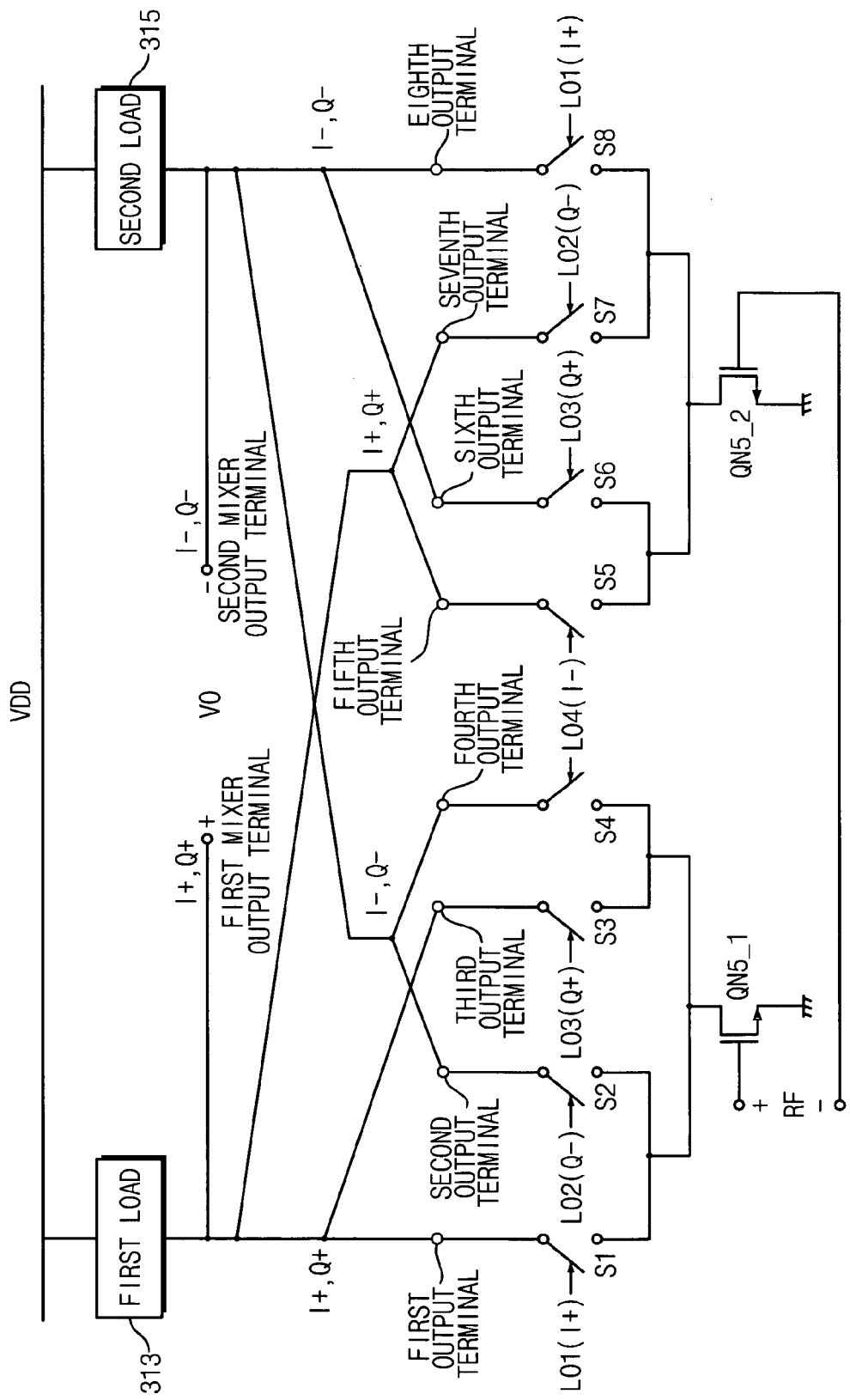

FIGS. 3A to 3C are block and circuit diagrams illustrating a double-balanced mixer according to another exemplary embodiment of the present invention.

A conventional double-balanced mixer includes two switching pairs and a transconducting stage having two transistors. The present embodiment of the invention includes four switching pairs and a transconducting stage having two transistors, and thus the mixer of this configuration is not a "double-balanced mixer" in the strictest sense. However, for convenience, the mixer according to another exemplary embodiment of the present invention will be hereinafter called a double-balanced mixer.

In FIG. 3A, the double-balanced mixer includes a first switching pair 301, a second switching pair 303, a third switching pair 305, a fourth switching pair 307, a transconducting stage 309, and a load impedance circuit 311.

The first switching pair 301 and the fourth switching pair 307 both receive a first local oscillator signal LO1 and a second local oscillator signal LO2. In a case where the first local oscillator signal LO1 is set up as a reference signal, the first local oscillator signal LO1 corresponds with an I+(in-phase) signal on the I-Q plot. The second local oscillator signal LO2 has a phase difference of 90° compared to the first local oscillator signal LO1. Where signal LO1 corresponds with (I+), the second local oscillator signal LO2 corresponds to Q−(quadrature) on the I-Q plot. Preferably, the first local oscillator signal LO1 (e.g., I+) and the second local oscillator signal LO2 (e.g., Q−) have the same magnitude and a phase difference of 90° therebetween.

The second switching pair 303 and the third switching pair 305 both receive a third local oscillator signal LO3 and a fourth local oscillator signal LO4. The third local oscillator signal LO3 is a Q+ signal and has a phase difference of 180° relative to the LO2(Q−) signal. Further, the fourth local oscillator signal LO4 has a phase difference of 180° compared to the first local oscillator signal LO1(I+). In other words, it corresponds to I− signal on the I-Q plot. Preferably, the third local oscillator signal LO3 (e.g., Q+) signal and fourth local oscillation signal LO4 (e.g., I−) signal have the same magnitude and a phase difference of 90° from each other.

The load impedance circuit 311 includes a first load 313 and a second load 315. The first load 313 is connected between a node (commonly connected to the first output terminal of the first switching pair 301 and to the third output terminal of the second switching pair 303, and also to the fifth output terminal of the third switching pair 305 and to the seventh output terminal of the fourth switching pair 307) and a supply voltage VDD.

The second load 315 is connected between a node (commonly connected to the second output terminal of the first switching pair 301 and to the fourth output terminal of the second switching pair 303, and also to the sixth output terminal of the third switching pair 305 and to the eighth output terminal of the fourth switching pair 307) and a supply voltage VDD.

The transconducting stage 309 is connected between a node (commonly connected to the first switching pair 301 and to the second switching pair 303, and also to the third switching pair 305 and to the fourth switching pair 307) and a ground or VSS. In a case where the double-balanced mixer is used in a direct conversion transmitter, a differential baseband signal is applied to the transconducting stage 309. In case where the double-balanced mixer is used in a direct conversion receiver, a differential RF signal is applied to the transconducting stage 309.

FIG. 3B is a circuit diagram illustrating a double-balanced mixer according to another exemplary embodiment of the present invention.

In the double-balanced mixer of FIG. 3B, the first switching pair (301 of FIG. 3A) includes switches S1 and S2, wherein the switch S1 is controlled by the LO1(I+) signal and switch S2 is controlled by the LO2(Q−) signal. The second switching pair includes switches S3 and S4, wherein switch S3 is controlled by the LO3(Q+) signal and switch S4 is controlled by the LO4(I−) signal.

The third switching pair includes switches S5 and S6, wherein switch S5 is controlled by the LO4(I−) signal and switch S6 is controlled by the LO3(Q+) signal. The fourth switching pair includes switches S7 and S8, wherein switch S7 is controlled by the LO2(Q−) signal and switch S8 is controlled by the LO4(I+) signal.

The first load 313 is connected between a FIRST MIXER OUTPUT TERMINAL node (commonly coupled to the first output terminal of the first switch S1 and to the third output terminal of the third switch S3, and also to the fifth output terminal of the fifth switch S5 and to the seventh output terminal of the seventh switch S7) and a supply voltage VDD.

The second load 315 is connected between a SECOND MIXER OUTPUT TERMINAL node (commonly coupled to the second output terminal of the second switch S2 and to the fourth output terminal of the fourth switch S4, and also to the sixth output terminal of the sixth switch S6 and to the eighth output terminal of the eighth switch S8) and a supply voltage VDD.

The transistor QN5_1, which performs a small signal function for the transconducting stage (309 of FIG. 3A), is coupled between a common node of the four switches S1, S2, S3, and S4 (of the first and second switching pairs 301 and 303 of FIG. 3A), and ground or VSS. Since bias current should be applied in order to operate the switching circuits, the transconducting stage should include a current source. However, in view of the small signal, the current source is modeled as a single resistor (not shown for convenience of explanation).

The transistor QN5_2, which performs a small signal function for the transconducting stage (309 of FIG. 3A), is connected between a common node of the four switches S5, S6, S7, and S8 (of the third and fourth switching pairs 305 and 307 of FIG. 3A), ground or VSS. A current source (e.g., a resistor not shown) may be disposed in series with the transistor QN5_2 and the ground in order to supply bias current.

The RF signal, which is a differential signal, is applied to each gate of transistors QN5_1 and QN5_2 of the transconducting stage (309 of FIG. 3A).

The switches S1, S2, S3, S4, S5, S6, S7, and S8 perform an on-off (switching) operation, and accordingly, the differential RF signal applied to the gates of the transistors QN5_1 and QN5_2 is multiplied by each of the LO1 to LO4 signals so that the multiplied signal may be output from the output terminals of each switch, which are connected to each other in odd and even groups of switches. The output terminals of odd switches S1, S3, S5, and S7 are commonly connected to the FIRST MIXER OUTPUT TERMINAL (node). The output terminals of even switches S2, S4, S6, and S8 are commonly connected to the SECOND MIXER OUTPUT TERMINAL (node). Further, the local oscillator signals are square waves or sine waves.

The RF signal is multiplied by the LO1(I+) signal which controls operation of the first switch S1 and by the LO3(Q+) signal which controls operation of the third switch S3. Therefore, the I+ signal and the Q+ signal on the I-Q plot are outputted from the first output terminal and the third output terminal in a summed manner. Further, the RF signal is multiplied by the LO4(I−) signal which controls operation of the fifth switch S5 and the LO2(Q−) signal which controls operation of the seventh switch S7. Since the gate of the transistor QN5_2 is a differential (auxiliary) input terminal, I+ signal and Q+ signal on the I-Q plot are outputted from the fifth output terminal and seventh output terminal in a summed manner. All of the odd switches (S1, S3, S5, S7) are commonly connected to the FIRST MIXER OUTPUT TERMINAL (node) and therefore, the I+ signals and the Q+ signals from four switches are outputted in a summed manner. Two small signal currents having the I+ characteristic are combined in-phase and two small signal currents having the Q+ characteristic are also combined in-phase through the foregoing process. Therefore, the effect of I-Q mismatch, which occurs because signals at the first and third output terminals are not orthogonal or have a different magnitude from each other, is reduced by the quadrature signals at the fifth and seventh output terminals. Further, since an in-phase component and a quadrature component do not interfere on the I-Q plot, output signals having the same magnitude and the phase difference of 90° can be obtained.

The RF signal is multiplied by the LO2(Q−) signal which controls operation of the second switch S2 and by the LO4

(I−) signal which controls operation of the fourth switch S4. Therefore, the I− signal and the Q− signal on the I-Q plot are outputted from the second and fourth output terminals in a summed manner. Further, the RF signal is multiplied by the LO3(Q+) signal which controls operation of the sixth switch S6 and by the LO1(I+) signal which controls operation of the eighth switch S8. However, since the gate of the transistor QN5_2 is a differential (auxiliary) input terminal, the I− signal and the Q− signal on the I-Q plot are outputted from the sixth and eighth output terminals in a summed manner. All of the even switches (S2, S4, S6, S8) are commonly connected to the SECOND MIXER OUTPUT TERMINAL (node) and therefore, the I− signals and the Q− signals from four switches are outputted in a summed manner. Two small signal currents having the I− characteristic are combined in the in-phase and two small signal currents having the Q− characteristic are also combined in the in-phase through the foregoing process. Therefore, the effect of I-Q mismatch, which occurs because signals at the second and fourth output terminals are not orthogonal or have a different magnitude, is reduced by a quadrature signal at the sixth and eighth output terminals. Further, since the in-phase component and the quadrature component do not interfere on the I-Q plot, the output signals having the same magnitude and the phase difference of 90° can be obtained. Further, since the above I− signal and Q− signal are orthogonal on the I-Q plot each other, they do not interfere. Accordingly, in case where the local oscillator signals LO1, LO2, LO3, and LO4 have the same magnitude, output signals having the same magnitude and a phase difference of 90° from each other can be obtained at the SECOND MIXER OUTPUT TERMINAL (common node of the second, fourth, sixth and eighth output terminals).

Further, since the signals at the first and second mixer output terminals have a phase difference of 180° therebetween, a mismatch on the I-Q plot is avoided and the occurrence of a second IMD can be minimized.

FIG. 3C is a circuit diagram illustrating a double-balanced mixer comprised using MOS transistors, according to the present embodiment of the invention.

Referring to FIG. 3C, the first switching pair (301 of FIG. 3A) includes a transistor QN1_1 and a transistor QN1_2. Thus, the first switch S1 of FIG. 3B corresponds to transistor QN1_1 and the second switch S2 of FIG. 3B corresponds to transistor QN1_2. The LO1(I+) signal is input to the gate of transistor QN1_1 and the LO2(Q−) signal is input to the gate of transistor QN1_2.

Similarly, the second switching pair (303 of FIG. 3A) includes a transistor QN2_1 and a transistor QN2_2. Thus, the third switch S3 of FIG. 3B corresponds to transistor QN2_1 and the fourth switch S4 of FIG. 3B corresponds to transistor QN2_2. The LO3(Q+) signal is input to the gate of transistor QN2_1 and the LO4(I−) signal is input to the gate of transistor QN2_2.

Similarly, the third switching pair (305 of FIG. 3A) includes a transistor QN3_1 and a transistor QN3_2. Thus, the fifth switch S5 of FIG. 3B corresponds to the transistor QN3_1 and the sixth switch S6 of FIG. 3B corresponds to the transistor QN3_2. The LO4(I−) signal is input to the gate of transistor QN3_1 and the LO3(Q+) signal is input to the gate of transistor QN3_2.

And similarly, the fourth switching pair (307 of FIG. 3A) includes a transistor QN4_1 and a transistor QN4_2. Thus, the seventh switch S7 of FIG. 3B corresponds to transistor QN4_1 and the eighth switch S8 of FIG. 3B corresponds to transistor QN4_2. The LO2(Q−) signal is input to the gate of transistor QN4_1 and the LO1(I+) signal is input to the gate of transistor QN4_2.

The first output terminal of transistor QN1_1, the third output terminal of transistor QN2_1, the fifth output terminal of transistor QN3_1, and the seventh output terminal of transistor QN4_1 are connected in common to resistor R1. Hence, resistor R1 corresponds to the first load 313 of FIG. 3B. Likewise, the second output terminal of transistor QN1_2, the fourth output terminal of transistor QN2_2, the sixth output terminal of transistor QN3_2, and the eighth output terminal of transistor QN4_2 are connected in common to resistor R2. Hence, resistor R2 corresponds to the second load 315 of FIG. 3B.

The transconducting stage includes transistors QN5_1 and QN5_2, and a current source It. The RF signal is differentially input to the gates gate of transistors QN5_1 and QN5_2. Further, the drain of the transistor QN5_1 is connected in common to the four (switching) transistors QN1_1, QN1_2, QN2_1, and QN2_2, and the source of transistor QN5_1 is coupled to the current source It. Similarly, the drain of the transistor QN5_2 is connected in common to the four transistors QN3_1, QN3_2, QN4_1, and QN4_2, and the source of transistor QN5_2 is coupled to the current source It.

The current source It supplies bias current to the (switching) transistors (S1, S2, S3, S4, S5, S6, S6, S7, and S8), constituting the first, second, third, and fourth switching pairs.

The transistors perform an on-off (switching) operation in accordance with the control of the local oscillator signals LO1 to LO4, and accordingly, the RF signals input to each gate of transistors QN5_1 and QN5_2 are multiplied by the LO1 to LO4 signals to be outputted from the output terminal of each (switching) transistor. Further, the local oscillator signals may be a square wave or a sine wave.

The RF signal is multiplied by the LO1(I+) signal controlling operation of the transistor QN1_1 and by the LO3(Q+) signal controlling operation of the transistor QN2_1. Therefore, I+ signal and Q+ signal on the I-Q plot are output from the first output terminal and third output terminal. The output signal obtains a small signal gain predetermined by the small signal output resistance of each transistor and the resistor R1.

The RF signal is multiplied by the LO4(I−) signal controlling operation of the transistor QN3_1 and by the LO2(Q−) signal controlling operation of the transistor QN4_1. Therefore, I+ signal and Q+ signal on the I-Q plot are output from the fifth output terminal and seventh output terminal. The outputted signal obtains a small signal gain predetermined by the small signal output resistance of each transistor and resistor R1. The first output terminal, the third output terminal, the fifth output terminal and the seventh output terminal are commonly connected to the FIRST MIXER OUTPUT TERMINAL (note). Therefore, the small signal currents formed in the first output terminal and the third output terminal are summed with the small signal currents formed at the fifth output terminal and seventh output terminal.

Further, since the in-phase component and the quadrature component do not interfere on the I-Q plot, output signals having the same magnitude and phase difference of 90° therebetween can be obtained.

The RF signal is also multiplied by the LO2(Q−) signal controlling operation of the transistor QN1_2 and by the LO4(I−) signal controlling operation of the transistor QN2_2. Therefore, an I− signal and Q− signal on the I-Q plot are outputted from the second output terminal and the fourth output terminal. The outputted signal obtains a small signal gain predetermined by the small signal output resistance of each transistor and the resistor R2.

The RF signal is also multiplied by the LO(Q+) signal controlling operation of the transistor QN3_2 and by the LO(I+) signal controlling operation of the transistor QN4_2. Therefore, an I− signal and a Q− signal on the I-Q plot are outputted from the sixth output terminal and eighth output terminal in a summed manner. The outputted signal obtains a small signal gain predetermined by the small signal output resistance of each transistor and the resistor R2. The second output terminal, the fourth output terminal, the sixth output terminal and the eighth output terminal are commonly connected to the SECOND MIXER OUTPUT TERMINAL (note). Therefore, the small signal currents formed in the second output terminal and the fourth output terminal are summed with the small signal currents formed at the sixth and eighth output terminals.

Further, since in-phase component and quadrature component do not mutually interfere on the I-Q plot, output signals having the same magnitude and the phase difference of 90° therebetween can be obtained. Accordingly, in a case where the local oscillator signals LO1, LO2, LO3, and LO4 have the same magnitude, at each of the first and second mixer output terminals output signals having the same magnitude and a phase difference of 90° can be obtained.

Further, since signals at the first mixer output terminal and the second mixer output terminal have a phase difference of 180° therebetween, the mismatch on the I-Q plot is avoided and the occurrence of a second IMD can be minimized.

Even though the switches ((S1, S2, S3, S4, S5, S6, S6, S7, and S8) are shown as being formed by MOS transistors in FIG. 3C, the switches also can be formed by bipolar transistors and by other switching technologies. Further, the resistors R1 and R2 preferably have the same value and are provided with a capacitor or inductor according to type of use to be practiced, such as an impedance circuit whose impedance magnitude changes based on frequency.

Where the double-balanced mixer in FIG. 3C is employed in a direct conversion receiver, a signal input to each gate of transistors QN5_1 and QN5_2 is the RF signal. Moreover, since the direct conversion is performed, the intermediate frequency is not outputted, and the center frequency of the RF signal is substantially identical to frequencies of the local oscillator signals.

Further, where the double-balanced mixer is employed in a direct conversion transmitter, a baseband signal is input to each gate of transistors QN5_1 and QN5_2. Accordingly, the frequency of the local oscillator signals is substantially identical to a center frequency of the differential signal Vo between a first mixer output terminal and second mixer output terminal.

Figure 4A:
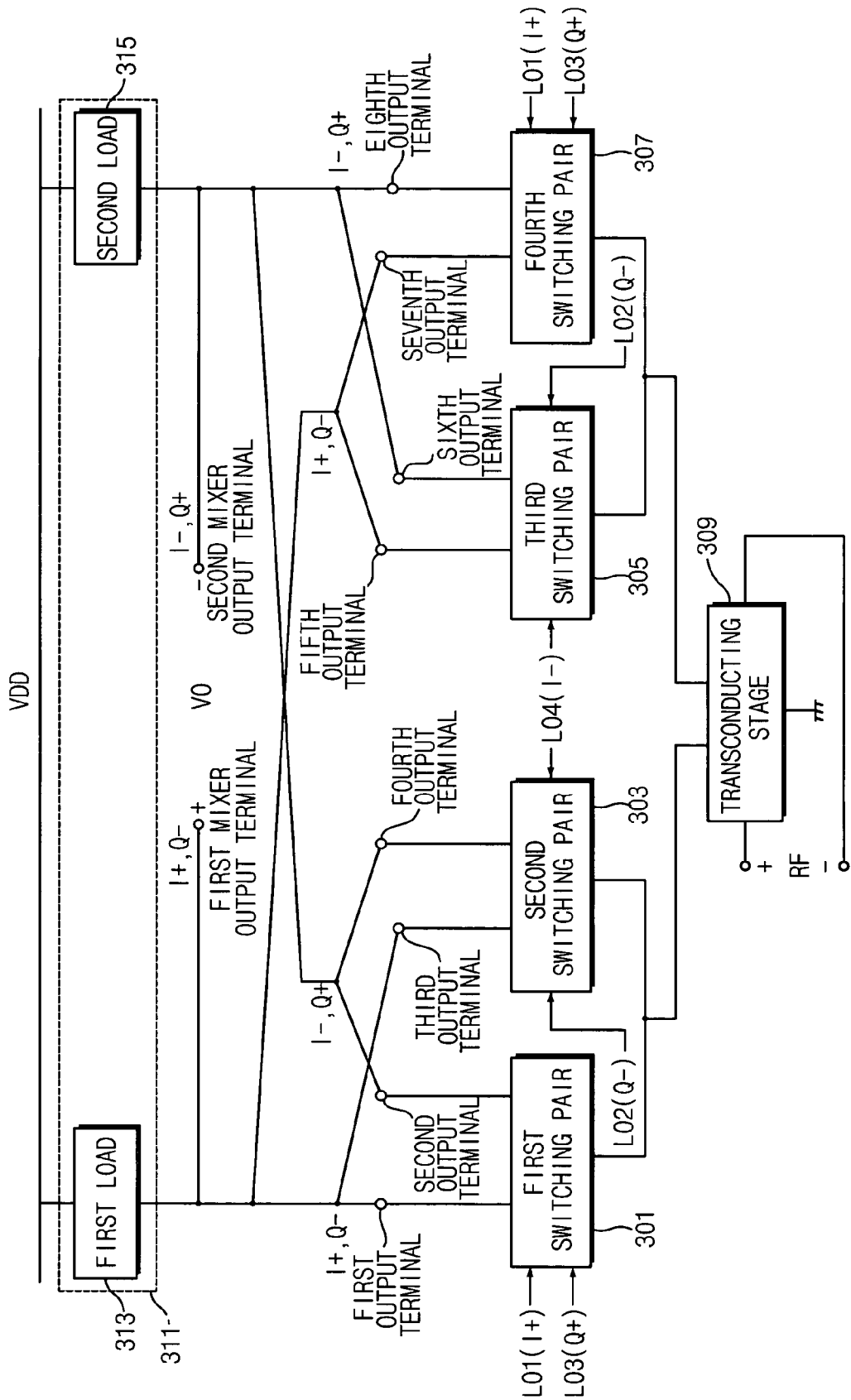
FIGS. 4A to 4C are block and circuit diagrams illustrating a double-balanced mixer according to still another exemplary of the present invention.
Figure 4B:
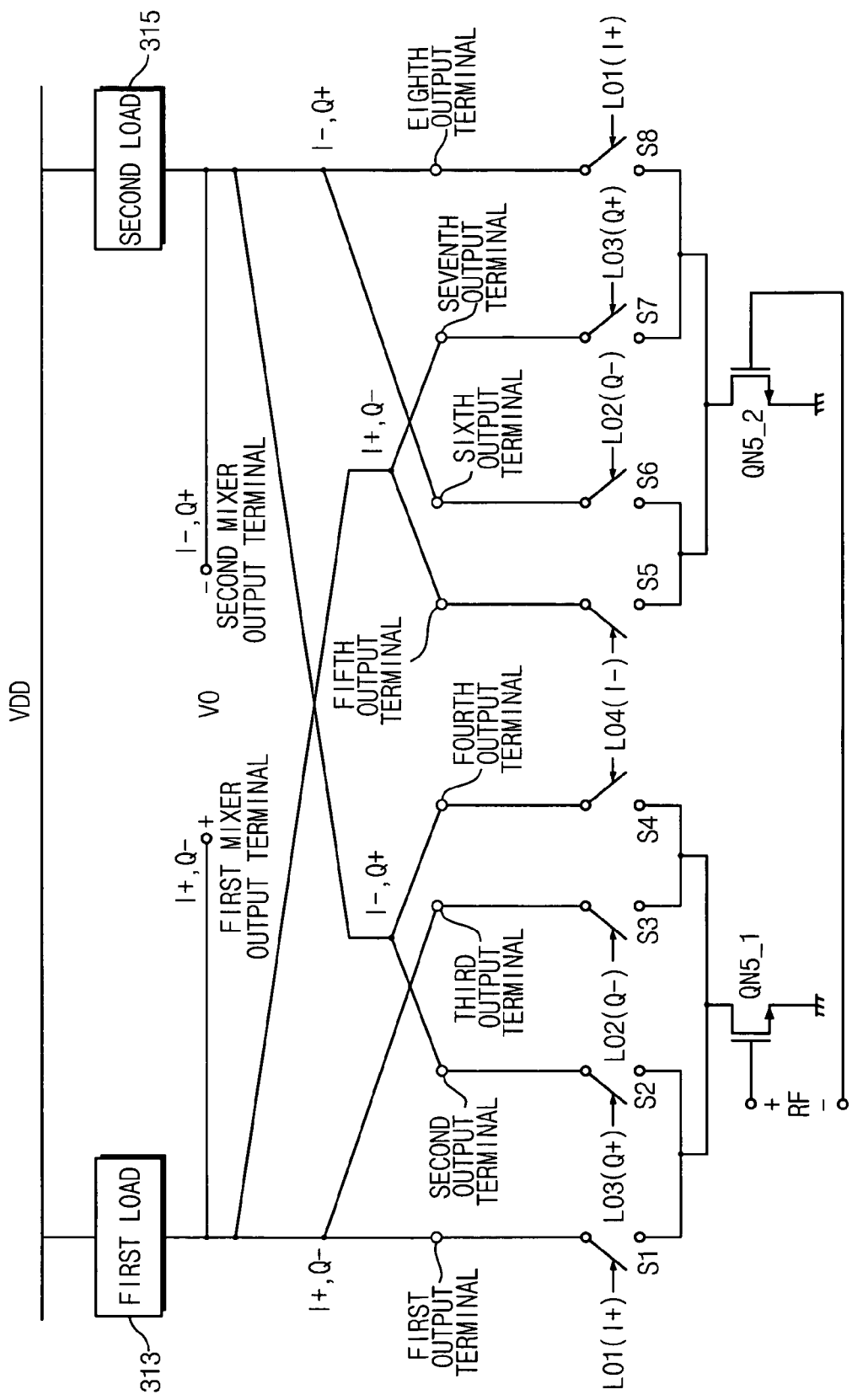
Figure 4C:
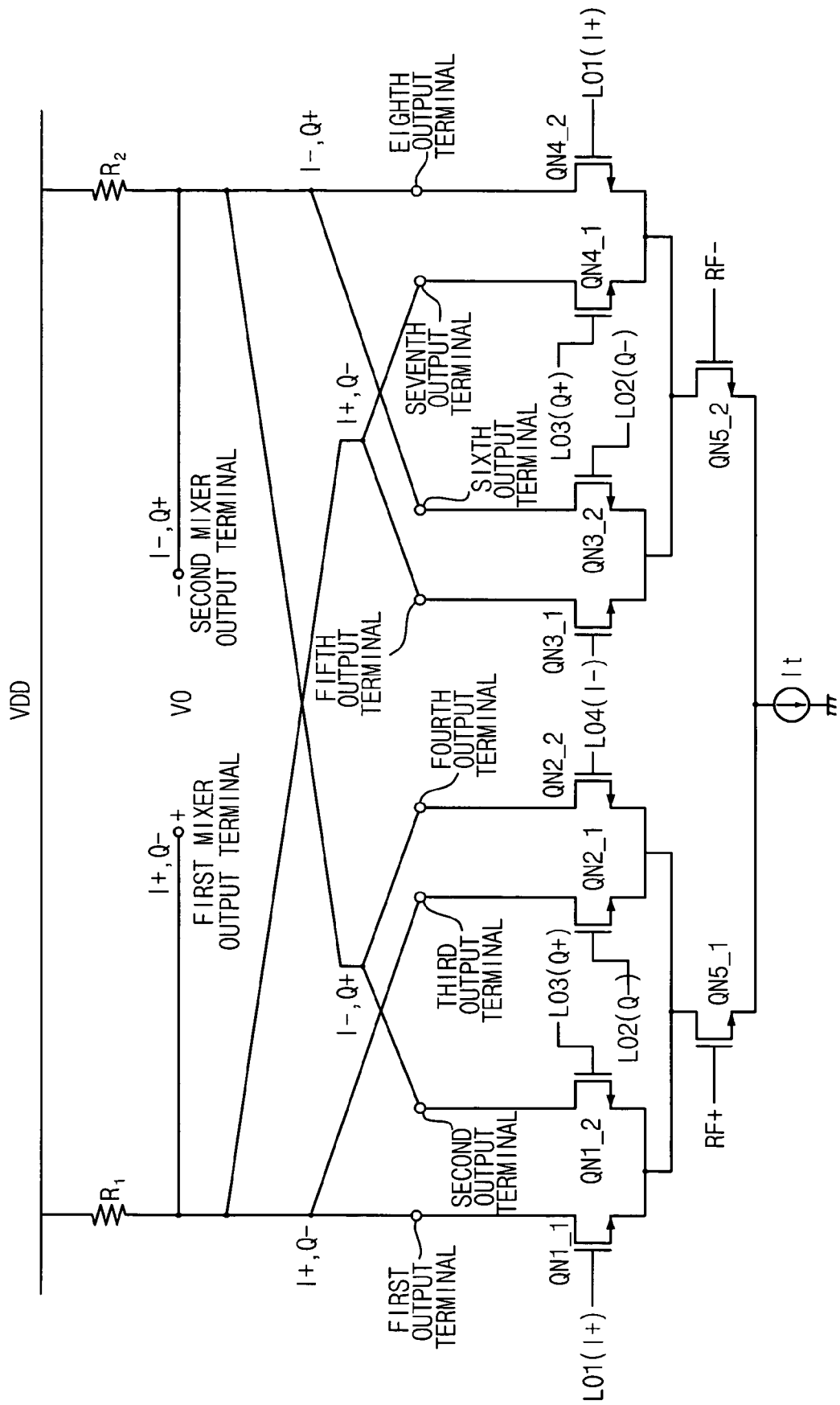

FIGS. 4A to 4C are block and circuit diagrams illustrating a double-balanced mixer according to another exemplary embodiment of the present invention.

The double-balanced mixer of FIG. 4A, is similar to the mixer shown in FIG. 3A except: that the LO3(Q+) signal instead of the LO2(Q−) signal is input to the first switching pair 301; the LO2(Q−) signal instead of the LO3(Q+) signal is input to the second switching pair 303; the LO2(Q−) signal instead of the LO3(Q+) signal is input to the third switching pair 305; and the LO3(Q+) signal instead of the LO2(Q−) signal is input to the fourth switching pair 307.

Hence, the I+ signal and Q− signal are outputted from the first output terminal and the third output terminal, and the I+ signal and Q− signal are outputted from the fifth output terminal and the seventh output terminal. Accordingly, signals that are orthogonal to each other are outputted from the first mixer output terminal. However, the quadrature component has a different phase from that in FIG. 3A.

Similarly, the I− signal and Q+ signal are outputted from the second output terminal and the fourth output terminal, and the I− signal and the Q+ signal are outputted from the sixth output terminal and the eighth output terminal. Accordingly, signals, that are orthogonal to each other and have a phase difference of 180° from the signals from the first mixer output terminal, are outputted from the second mixer output terminal.

Referring to FIG. 4B, the double-balanced mixer of FIG. 4B is similar to the mixer shown in FIG. 3B except that: the second switch S2 is controlled by the LO3(Q+) signal; the third switch S3 is controlled by the LO2(Q−) signal; the sixth switch S3 is controlled by the LO2(Q−) signal; and the seventh switch S7 is controlled by the LO3(Q+) signal. The signal from the output terminal of each switch is the same as that is described in FIG. 4A.

Referring to FIG. 4C, the double-balanced mixer of FIG. 4C is similar to the exemplary embodiment shown in FIG. 3C except that the LO3(Q+) signal is input to the gate of transistor QN1_2, the LO2(Q−) signal is input to the gate of transistor QN2_1, the LO2(Q−) signal is input to the gate of transistor QN3_2, and the LO3(Q+) signal is input to the gate of transistor QN4_1. Further, the signal in the output terminal of each transistor is the same as that is described in FIG. 4A.

Therefore, according to embodiments of the present invention, output signals that are orthogonal to each other outputted, so that I-Q mismatch may be minimized and the IP2 characteristic may be improved.

Figure 5B:
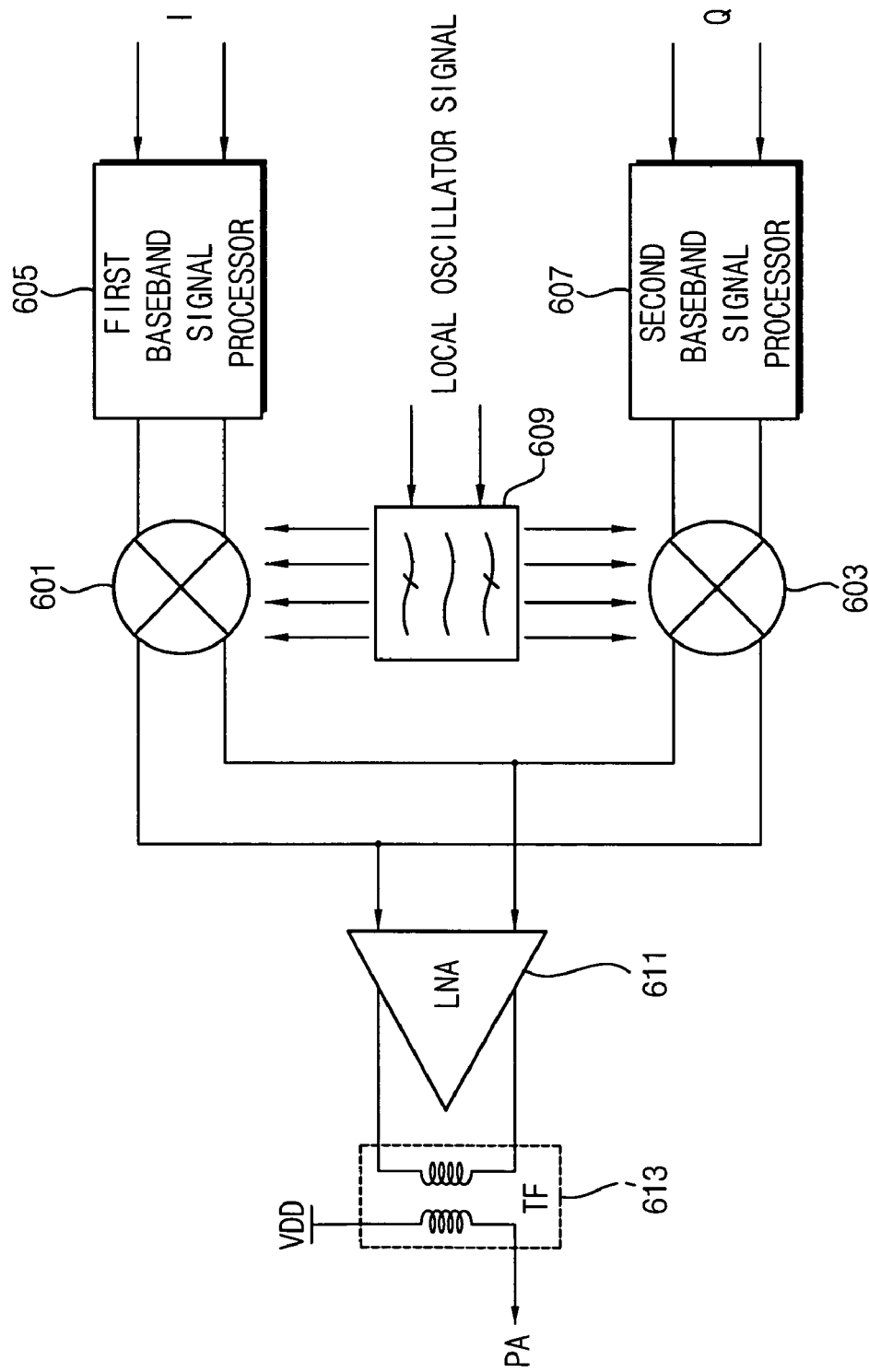
FIG. 5B is a block diagram illustrating a direct conversion transmitter including a mixer according to an embodiment of the present invention.

FIG. 5A and FIG. 5B are block diagrams illustrating a direct conversion transmitter and a direct conversion receiver, respectively, according to the other exemplary embodiment of the present invention.

FIG. 5A is a block diagram illustrating a direct conversion receiver according to an embodiment of the present embodiment.

Referring to FIG. 5A, the direct conversion receiver includes a low noise amplifier (LNA) 513 configured to amplify the received radio frequency (RF) signal, a transformer 511 configured to perform impedance matching of the received RF signal, a first mixer 501 configured to perform a first down-conversion, a first baseband signal processor 505, a second mixer 503 configured to perform a second down-conversion, a second baseband signal processor 507, and a phase shifter 509.

The phase shifter 509 receives a local oscillator (LO) signal, output from a local oscillator (not shown), and phase-shifts the received LO signal so that the LO signal and the phase-shifted LO signal may be outputted to the first mixer 501 and to the second mixer 503. Hence, output signals of the phase shifter 509 input to the first mixer 501 and second mixer 503 are a first local oscillator LO1 signal, a second local oscillator LO2 signal, a third local oscillator LO3 signal, and a fourth local oscillator LO4 signal, which have a different phase from each other.

In a case where the first local oscillator LO1 signal is set up as a reference signal, the second local oscillator LO2 signal has a phase difference of 90° from the first local oscillator signal, the third local oscillator LO3 signal has a phase difference of 180° from the first local oscillator LO1 signal, and the fourth local oscillator LO4 signal has a phase difference of 180° from the second local oscillator LO2 signal.

The first mixer 501 receives the RF signal and the LO signals (LO1, LO2, LO3, LO4) output from the phase shifter 509. Similarly, the second mixer 503 receives the RF signal and the LO signals output (LO1, LO2, LO3, LO4) from the phase shifter 509.

The structure of the first mixer 501 and of the second mixer 503 may be the same as that of the mixers shown and described in of FIG. 2A, 3A or 4A.

Accordingly, the received RF signal is input to the transconducting stage of the first mixer 501, and four phases of local oscillator LO signals that are the signals output by the phase shifter 509 are input to the switching pairs (see e.g., FIG. 2A, 3A, or 4A).

Since the center frequency of the RF signal is substantially the same as the frequency of local oscillator LO signal in a direct conversion receiver, signals including a baseband signal components are outputted from the mixer output terminals of the first mixer 501 and of the second mixer 503. Thus, the products of multiplying the received RF signal and the local oscillator LO signals, by operation of the mixers, are outputted. Therefore, when a Fourier Transform of the products is executed, it can be understood that a signal component having a difference between frequencies of the received RF signal and the local oscillator signals is outputted. Such an operation is called a down-conversion.

The outputs of the first mixer 501 are input to the first base band signal processor 505 and filtered and amplified to be outputted as a baseband signal I (in-phase) component. Similarly, an outputs of the second mixer 503 are input to the second baseband signal processor 507 and filtered and amplified to be outputted as a baseband signal Q (quadrature) component that is orthogonal to the baseband signal I component.

FIG. 5B is a block diagram illustrating a direct conversion transmitter according to an embodiment of the present embodiment.

Referring to FIG. 5B, the direct conversion transmitter includes a first baseband signal processor 605 configured to filter and amplify a baseband signal I component, a second baseband signal processor 607 configured to filter and amplify a baseband signal Q component, a phase shifter 609 configured to shift the phase of a local oscillator LO signal, a first mixer 601 configured to perform a first up-conversion, a second mixer 603 configured to perform a second up-conversion, a driving amplifier 611 configured to amplify the output of the mixers and to improve current-driving capability, and a transformer 613 configured to perform impedance matching.

The phase shifter 609 receives a local oscillator LO signal, the output of a local oscillator (not shown), and phase-shifts the received LO signal so that the phase-shifted LO signal (LO1, LO2, LO3, LO4) may be outputted to the first mixer 601 and to the second mixer 603. Hence, output signals of the phase shifter 609 are input to the first mixer 601 and the second mixer 603 are a first local oscillator LO1 signal, a second local oscillator LO2 signal, a third local oscillator LO3 signal, and a fourth local oscillator LO4 signal, each having a different phase from others. In a case where the first local oscillator signal is set up as a reference signal, the second local oscillator LO2 signal has a phase difference of 90° from the first local oscillator LO1 signal, the third local oscillator LO3 signal has a phase difference of 180° from the first local oscillator LO1 signal, and the fourth local oscillator LO4 signal has a phase difference of 180° from the second local oscillator LO2 signal.

The first mixer 601 receives the output from the first baseband signal processor 605 and the phase-shifted LO signals (LO1, LO2, LO3, LO4) from the phase shifter 609. Similarly, the second mixer 603 receives output from the second baseband signal processor 607 and the phase-shifted LO signals (LO1, LO2, LO3, LO4) from the phase shifter 609.

The first baseband signal processor 605 filters and amplifies a baseband signal I component to be input to the (transconducting stage of the) first mixer 601, and the second baseband signal processor 607 filters and amplifies a baseband signal Q component to be input to the (transconducting stage of the) second mixer 603.

The structure of the first mixer 601 and of the second mixer 603 may same as that of the mixers shown and described in FIG. 2A, 3A, or 4A.

Accordingly, a baseband signal I component or a baseband signal Q component is input to the (transconducting stage of the) first mixer 601, and four phases of local oscillator LO signals (which are the signals outputted by the phase shifter 509) are input to the switching pairs (see FIG. 2A, 3A, or 4A). The product of multiplying the baseband signal and the local oscillator LO signals (LO1, LO2, LO3, LO4), by operation of the mixers, are summed in a predetermined manner and outputted. Therefore, when the Fourier Transform of the summed products is executed, it can be understood that a signal component having the sum of frequencies of the baseband signal and the local oscillator signals is outputted. Such an operation is called an up-conversion. Hence, the RF signal is outputted from the mixer output terminal of the first mixer 601 or of second mixer 603, through the modulation process described above. The center frequency of the outputted RF signal is substantially the same as the frequency of local oscillator LO signal input to the phase shifter 609.

The outputted RF signal is input to a power amplifier (PA) through the driving amplifier 611 and the transformer 613.

According to embodiments of the present invention as described above, signals having two (e.g., I and Q) components that are orthogonal to each other are outputted from the mixer output terminals, so that the I-Q mismatch may be minimized and the IP2 characteristics is improved. Further, the DC component of the mixer's output signal is removed and thus a self-mixing phenomenon may be improved.

The general form of the output signal of a mixer can be given as the following expression:

$$Vo = Vdc + a_1 v_{in} + a_2 v_{in}^2 + a_3 v_{in}^3 + \ldots \qquad \text{Expression 1}$$

In the above formula (Expression 1), Vdc is DC voltage at a mixer output terminal, and Vo is the instantaneous value at the mixer output terminal. A second harmonic component is generated by coefficient $a_2$ of Expression 1 and thus, the IP2 characteristic is deteriorated thereby.

However, in the present invention, when RF(I+)=cos$(w_1 t)$+cos$(w_2 t)$, RF(Q+) is sin$(w_1 t)$+sin$(w_2 t)$, if LO(I+)=cos$(w_3 t)$, LO(Q+)=sin$(w_3 t)$, and signals that are orthogonal to each other are outputted. The output signals of mixer can be given in the following expressions:

$$Vo1 = Vdc + a_1(\cos(w_4 t) + \cos(w_5 t)) + a_2(\cos(w_4 t) + \cos(w_5 t))^2 + \ldots \qquad \text{Expression 2}$$

$$Vo2 = Vdc + a_1(\sin(w_4 t) + \sin(w_5 t)) + a_2(\sin(w_4 t) + \sin(w_5 t))^2 + \ldots \qquad \text{Expression 3}$$

In Expression 2, $w_4$ is $w_1$-$w_3$, and $w_5$ is $w_2$-$w_3$. Since the output signal Vo of the mixer is Vo1-Vo2, the DC component and the ($w_4$-$w_5$) component of second IMD term do not exist in Vo.

Therefore, according to the present invention, the DC component can be removed and IP2 characteristics can be improved.

Although the present invention has been described with reference to exemplary embodiments thereof, it is to be understood that various modifications and changes may be made thereto without departing from the spirit or scope of the present invention, which is defined by the claims herein. Therefore, the appended claims are intended to define the scope of the present invention.

What is claimed is:

1. A mixer comprising:
   a first switch configured to be controlled by a first local oscillator signal and a second switch configured to be controlled by a second local oscillator signal, the second local oscillator signal having a phase difference of about 90° with respect to the first local oscillator signal;
   a third switch configured to be controlled by a third local oscillator signal and a fourth switch configured to be controlled by a fourth local oscillator signal, the fourth local oscillator signal having a phase difference of about 90° with respect to the third local oscillator signal,
   wherein the third local oscillator signal has a phase difference of about 180° with respect to the second local oscillator signal and the fourth local oscillator signal has a phase difference of about 180° with respect to the first local oscillator signal, and
   a transconducting stage, electrically coupled to the first, second, third, and fourth switches and configured to receive an input signal,
   wherein the input signal is multiplied respectively by the local oscillator signals to generate first, second, third, and fourth multiplied signals, and the first and third multiplied signals are provided respectively from outputs of the first and third switches to a first mixer output terminal of the mixer and the second and fourth multiplied signals are provided respectively from outputs of the second and fourth switches to a second mixer output terminal of the mixer.

2. The mixer of claim 1, wherein the transconducting stage includes only one transistor for amplifying the input signal.

3. The mixer of claim 1, wherein the transconducting stage consists essentially of one amplifier connected in series with a current source.

4. The mixer of claim 3, wherein the amplifier consists essentially of one transistor and the current source consists essentially of a resistor.

5. The mixer of claim 1, further comprising a load impedance circuit including:
   a first load conductively connected to the first switch and the third switch and configured to conduct a bias current to the first switch and to the third switch; and
   a second load conductively connected to the second switch and to the fourth switch and configured to conduct a bias current to the second switch and to the fourth switch.

6. The mixer of claim 1, wherein the transconducting stage includes a current source connected in series with a transconducting transistor to which input signal is applied, for supplying a bias current to the first, second, third, and fourth switches.

7. A mixer comprising:
   a first switch configured to be controlled by a first local oscillator signal;
   a second switch configured to be controlled by a second local oscillator signal, the second local oscillator signal having a phase difference of about 90° with respect to the first local oscillator signal;
   a third switch configured to be controlled by a third local oscillator signal, the third local oscillator signal having a phase difference of about 180° with respect to the second local oscillator signal;
   a fourth switch configured to be controlled by a fourth local oscillator signal, the fourth local oscillator signal having a phase difference of about 90°0 with respect to the third local oscillator signal and the fourth local oscillator signal having a phase difference of about 180° with respect to the first local oscillator signal;
   a fifth switch configured to be controlled by the fourth local oscillator signal;
   a sixth switch configured to be controlled by the third local oscillator signal;
   a seventh switch configured to be controlled by the second local oscillator signal; and
   an eighth switch configured to be controlled by the first local oscillator signal,
   wherein output signals of the first, third, fifth, and seventh switches are provided to a first mixer output terminal of the mixer and output signals of the second, fourth, sixth, and eight switches are provided to a second mixer output terminal of the mixer.

8. The mixer of claim 7, further comprising a load impedance circuit including:
   a first load coupled in common to the output terminals of the first, third, fifth and seventh switches; and
   a second load coupled in common to the output terminals of the second, fourth, sixth and eighth switches.

9. The mixer of claim 7, further comprising a transconducting stage wherein:
   a first input signal and a second input signal are inputted to the transconducting stage as a differential input signal.

10. The mixer of claim 7, wherein a center frequency at the output terminal of each of the switches is substantially the same as a frequency of the local oscillator signals when the mixer is employed in a transmitter, and a center frequency of the differential input signal is substantially the same as the frequency of the local oscillator signals when the mixer is employed in a receiver.

11. A direct conversion receiver comprising:
   a phase shifter configured to output phase shifted local oscillator signals, the phase shifter outputting a first local oscillator signal, a second local oscillator signal having a phase difference of about 90° with respect to the first local oscillator signal, a third local oscillator signal having a phase difference of about 180° with respect to the first local oscillator signal, and a fourth local oscillator signal having a phase difference of about 180° with respect to the second local oscillator signal;
   a first mixer configured to perform a first down-conversion on an RF signal using the phase shifted local oscillator signals;
   a first baseband signal processor configured to generate a baseband signal corresponding to an in-phase component from an output of the first mixer;
   a second mixer configured to perform a second down-conversion on said RF signal using the phase shifted local oscillator signals; and
   a second base band signal processor configured to generate a baseband signal corresponding to a quadrature component from an output of the second mixer,
   wherein the first mixer includes a first switch configured to receive the first oscillator signal and a second switch configured to received the second oscillator signal, and the second mixer includes a third switch configured to receive the third oscillator signal and a fourth switch configured to receive the fourth oscillator signal, and
   wherein output signals of the first and third switches are provided to a mixer output terminal of the first mixer and output signals of the second and fourth switches are provided to a mixer output terminal of the second mixer.

12. The direct conversion receiver of claim 11, wherein the at least one of the first mixer and the second mixer further includes:

a transconducting stage configured to receive the RF signal and connected in series between a common node of the first and second switches and a common node of the third and fourth switches.

13. The direct conversion receiver of claim 12, wherein a center frequency of the RF signal is substantially the same as a frequency of the local oscillator signals.

14. The direct conversion receiver of claim 11, wherein a center frequency of the RF signal is substantially the same as the frequency of the local oscillator signals.

15. A direct conversion transmitter comprising:

a phase shifter configured to output phase-shifted local oscillator signals;

a first baseband signal processor configured to receive a baseband signal corresponding to an in-phase component;

a first mixer configured to receive an output of the first baseband signal processor and configured to perform a first up-conversion generating an RF signal based on the phase-shifted local oscillator signals;

a second baseband signal processor configured to receive a baseband signal corresponding to a quadrature component; and a second mixer configured to receive an output of the second baseband signal processor and configured to perform a second up-conversion generating the RF signal based on the phase-shifted local oscillator signals, wherein the phase shifter is configured to output a first local oscillator signal, a second local oscillator signal having a phase difference of about 90° with respect to from the first local oscillator signal, a third local oscillator signal having a phase difference of about 180° with respect to the first local oscillator signal, and a fourth local oscillator signal having a phase difference of about 180° with respect to the second local oscillator signal, wherein the first mixer includes a first switch configured to receive the first local oscillator signal and a second switch configured to receive the second local oscillator signal, and the second mixer includes a third switch configured to receive the third local oscillator signal and a fourth switch configured to receive the fourth local oscillator signal, and wherein output signals of the first and third switches are provided to a mixer output terminal of the first mixer and output signals of the second and fourth switches are provided to a mixer output terminal of the second mixer.

16. The direct conversion transmitter of claim 15 wherein at least one of the first mixer and the second mixer includes:

a transconducting stage, connected between a common node of the first and second switches and a common node of the third and fourth switches, and configured to receive an output from the first or second baseband signal processor; and a load impedance portion coupled between the first and second pairs of switches and a supply voltage.

17. The direct conversion transmitter of claim 16, wherein a center frequency of the RE signal is substantially the same as the frequency of the local oscillator signals.

18. The direct conversion transmitter of claim 15, further comprising:

a transconducting stage coupled in common to the first second, third and fourth switches, and configured to receive an output from the first or the second base band signal processor; and a load impedance portion coupled between the first the second, the third and the fourth switches and a supply voltage.

19. The direct conversion transmitter of claim 18, wherein the center frequency of the RE signal is substantially the same as the frequency of the local oscillator signals.

* * * * *